(12) United States Patent
Remi

(10) Patent No.: US 7,293,053 B2
(45) Date of Patent: Nov. 6, 2007

(54) DIGITAL RANDOM GENERATOR BASED ON AN ARITHMETIC COMPRESSOR

(75) Inventor: Frédéric Remi, Cholet (FR)

(73) Assignee: Thales, Neuilly Sur Seine (FR)

( * ) Notice: Subject to any disclaimer, the term of this patent is extended or adjusted under 35 U.S.C. 154(b) by 688 days.

(21) Appl. No.: 10/721,079

(22) Filed: Nov. 26, 2003

(65) Prior Publication Data

US 2004/0107229 A1    Jun. 3, 2004

(30) Foreign Application Priority Data

Nov. 29, 2002 (FR) ................... 02 15063

(51) Int. Cl.
*G06F 7/58* (2006.01)
(52) U.S. Cl. ........................... 708/250
(58) Field of Classification Search ........... 708/250
See application file for complete search history.

(56) References Cited

U.S. PATENT DOCUMENTS 4,176,399 A * 11/1979 Hoffmann et al. .......... 708/250
4,355,366 A * 10/1982 Porter ....................... 708/255
5,757,923 A    5/1998 Koopman, Jr.
5,808,572 A    9/1998 Chan din-yuen et al.
6,571,263 B1 * 5/2003 Nagai ............................ 708/3

FOREIGN PATENT DOCUMENTS

EP    1223506    7/2002

* cited by examiner

*Primary Examiner*—Tan V. Mai
(74) *Attorney, Agent, or Firm*—Lowe Hauptman Ham & Berner, LLP

(57) ABSTRACT

The proposed device enables the construction of a perfect random generator by combining any physical source, concerning which no assumptions of quality are made, with an extractor. The extractor is constituted by an arithmetic encoder and an output linear function enabling the residual output bias to be smoothened.

9 Claims, 2 Drawing Sheets

DIGITAL RANDOM GENERATOR BASED ON AN ARITHMETIC COMPRESSOR

BACKGROUND OF THE INVENTION

1. Field of the Invention

The invention relates to a random digital generator that relies specially on an arithmetic compressor.

It can be applied for example in industrial devices using pure random numbers. It can be used in games of luck on the Internet, in the RAPIDO system of drawing lots for the French lottery system or again in astronomy computations.

It can also be used in cryptography, since the security of encryption algorithms and of many cryptographic protocols relies on the existence of totally random parameters (such as encryption keys, etc.).

The invention can also be used in secured online procedures (purchasing, teleprocedures, the authentication of documents, etc.) based on the use of an electronic signature that increases requirements in terms of pure "real-time" random numbers. An e-commerce server must indeed be capable of producing several hundreds of electronic signatures per second.

2. Description of the Prior Art

The generation of digital random values by means of an electronic device consists of the more or less direct sampling of an unstable and non-reproducible parameter. This parameter may be the amplitude of an analog signal, the duration between two events, etc.

The random aspect of the information obtained is then related to the characteristics of the original signal and/or the imprecision of the measurement. In present-day practice, industry uses various methods for the generation of random numbers, such as the analog amplification of a noise-ridden signal and the sampling of a clock A with an asynchronous clock B.

The random values generated by these various physical sources generally have characteristic statistical defects, such as defects of equidistribution, the existence of pseudo-periods, etc. The consequence of these defects is that the real entropy of the random value produced is lower than its maximum theoretical entropy (SHANNON's entropy measures the mean information provided by a random variable).

There are several solutions of varying complexity and varying cost that can be used to eliminate these characteristic biases. These solutions include, for example:

The addition of a cryptographic smoothing device downstream to produce a perfect-sequence of random values from a sequence with a higher bit rate having entopic defects. The smoothing device used is, in practice, a pseudo-random generator (PRG) that can be implemented in either hardware or software form depending on the security and bit rate constraints desired. FIG. 1 is a drawing of such a device, The use of several physical sources in parallel to smoothen the defects.

Furthermore, the complexity of the different architectures (the implementation of the random generator in two FPGAs) furnishes methods of random generation that are not suited, in terms of throughput, to "real-time" needs for perfect random values.

The patent application EP 1 223 506 describes a random number generator that implements a dictionary-based method of compression. This method is well suited to the compression of high-redundancy sources but not to the compression of binary sequences derived from the sampling of a physical source.

The idea on which the method and device according to the invention are based uses especially the concept of the random extractor. A random extractor is a deterministic device designed to be inserted after a physical random source in order to eliminate its defects.

SUMMARY OF THE INVENTION

The invention relates to a random number generator adapted to the reception at input of a number of bits coming from a physical source. The random number generator is characterized by the fact that it comprises, in combination with at least one symbol-generating physical source, an arithmetic encoder and means adapted to smoothing the residual biases at output of the decoder. The association of the arithmetic encoder and of the linear function is called a random extractor and constitutes the deterministic device of the random generator.

The invention also relates to a method for the generation of random numbers comprising at least the following steps in combination:

The reception of several symbols from a physical source,

The transmission of the symbols to an arithmetic encoder step,

The smoothing the encoded symbols using a linear function.

The invention has especially the following advantages:

Easy implementation in both hardware and software form,

A possibility of offering perfectly random throughputs in accordance with the requirements of e-commerce servers, an adaptability of the extractor to the characteristics of the physical source which are likely to evolve over time, the possibility of implementing a rudimentary physical source which, as the case may be, is capable of generating binary sequences having low-level characteristics of randomness (i.e. a strong bias toward equidistribution, dependency between the bits generated, Markovian character ).

BRIEF DESCRIPTION OF THE DRAWINGS

Other features and advantages of the invention shall appear more clearly from the following description, given by way of an illustration that in no way restricts the scope of the invention, and from the appended drawings of which.

MORE DETAILED DESCRIPTION

Figure 1:
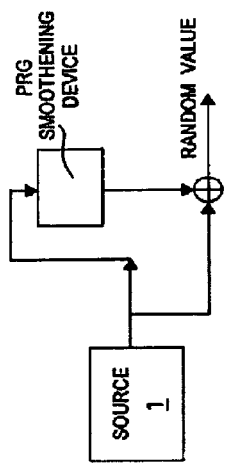
FIG. 1 is a block diagram of a random generator implemented according to the prior art.
Figure 2:
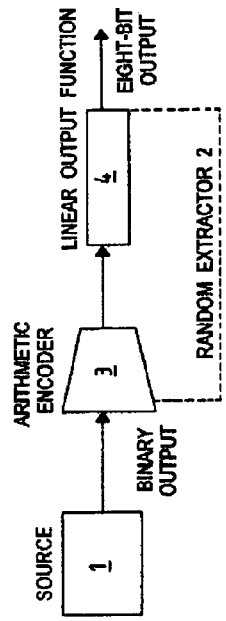
FIG. 2 is a functional block diagram of an exemplary architecture of a random generator according to the invention.

FIG. 2 is a block diagram of an exemplary architecture of a random generator according to the invention. It comprises, for example, a physical source 1 that is any source whatsoever and a random extractor 2 positioned just after it. The random extractor 2 is formed by an arithmetic encoder 3 and an output linear function 4.

For a simple implementation of the source, it is possible for example to generate an oscillating digital signal, whose frequency is unstable as a function of the temperature, the power supply voltage and the dispersal of the characteristics between electronic chips. It suffices then to sample this signal by means of a clock signal coming from the system (from the clock of the microprocessor of the card for example). Since the two clocks involved are asynchronous and sliding with respect to each other, the resulting signal has low predictability and low reproducibility.

The arithmetic encoding is a dynamic statistical encoding suited to the characteristics of the physical source. The encoder is, for example, parametrized to process the symbols generated by the physical source independently of each other (using Bernoulli's model) or else they are parametrized so as to dependent on each other (using Markov's model). In the example given, the model chosen is a Markovian model that proves to be particularly efficient for modeling the type of physical source that we shall describe in this invention.

The law of probability used by the compressor is, for example, permanently adjusted as a function of the symbols that have actually appeared.

One of the useful features of the invention is that the arithmetic encoder is very simple to implement in hardware form. The RG (random generator) constituted by the physical source, the encoder and the output linear function can be implemented, for example, in an FPGA type programmable component. The steps of the method can be carried out in a computer programmed to execute certain algorithmic tasks.

As a consequence, the law of probability used by the compressor is permanently adjusted as a function of the symbols that have really appeared.

The principle of arithmetic encoding lies in encoding a message by a number written for example in binary numeration and in floating-point representation. This number is derived from computations of nested intervals. Each interval corresponds to a symbol of the source and has a size proportional to its frequency of occurrence. The compression is obtained by noting that the number of significant digits needed to decide upon membership in an interval is smaller than in the case of the big intervals.

Each symbol s is represented, for example, by an interval $[m_s, M_s]$ such that:
the size of the interval $\Delta = M_s - m_s$ is proportional to the probability of appearance of the symbol s;
The intervals are separated;
The combination of the intervals is equal to the interval [0,1]

The encoding algorithm is then the following:
1. initialize m→0 and M→1
2. for each symbol s of the message to be compressed, update:
   a. $\Delta \leftarrow M-m$;
   b. $m \leftarrow m + \Delta \times m_s$;
   c. $M \leftarrow m + \Delta \times M_s$
3. the compressed message is the last value of m.

The following encrypted example furnishes a simple explanation of the arithmetical encoding using floating-point representation.

The physical source used is S={a,b,c}. The frequencies of occurrence of the three symbols are given in the Table 1 below:

| Symbol | Frequency | $[m_s, M_s]$ |
|---|---|---|
| A | ½ | (0.0, 0.5) |
| B | ¼ | (0.5, 0.75) |
| C | ¼ | (0.75, 1.0) |

Table 2 here below describes the steps of the encoding of the string of characters <<baca>>. The compressed message is the last value of m

| Symbols to be encoded | Size of the interval | m | M |
|---|---|---|---|
|  |  | 0 | 1 |
| B | 1 | 0.5 | 0.75 |
| A | 0.25 | 0.5 | 0.625 |
| C | 0.125 | 0.59375 | 0.625 |
| A | 0.03125 | 0.59375 | 0.609375 |

Figure 3:
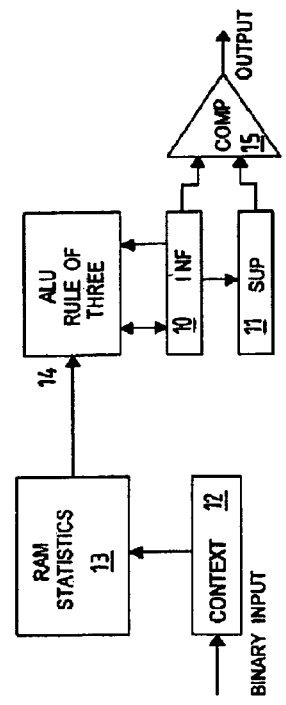
FIG. 3 is a graph of the arithmetic encoder.

FIG. 3 gives a schematic view of an exemplary architecture of an arithmetic encoder.

The encoder comprises, for example, a statistics table or RAM 13, receiving context information 12. The context information is delivered by the physical source in the form of a current character. Sixteen-bit registers (referenced 10 and 11) store the upper and lower values of the above-mentioned interval. An arithmetic logic unit (ALU) 14 is programmed to update the values of the boundaries Inf and Sup of the intervals as a function of the new statistical tables stored in RAM 13.

A comparator 15 compares the registers Inf and Sup and delivers the most significant bits that these registers have in common.

The compression of the source corresponds to an interval that is described at each instance by the two registers 10, 11 which respectively contain the lower boundary and the upper boundary. Only the 16 last significant bits of the current interval are stored, namely only those bits after which the digits are distinct.

The steps of encoding a symbol consist, for example, in:
updating the table of the statistics 13 on the input symbols as a function of the contexts 12, i.e., the preceding symbols,
computing the new values of the boundaries of the interval, by a rule of three, using an arithmetic logic unit ALU 14,
emptying the registers of the most significant bits that they have in common. These bits form the output of the comparator 15.

In practice it is, for example, integer arithmetic and not real arithmetic that is used. Since the registers have smaller sizes than the message to be compressed, the registers containing the values of m and M are emptied of the most significant bits that they have in common, as and when the new symbols to be encoded arrive.

Figure 4:
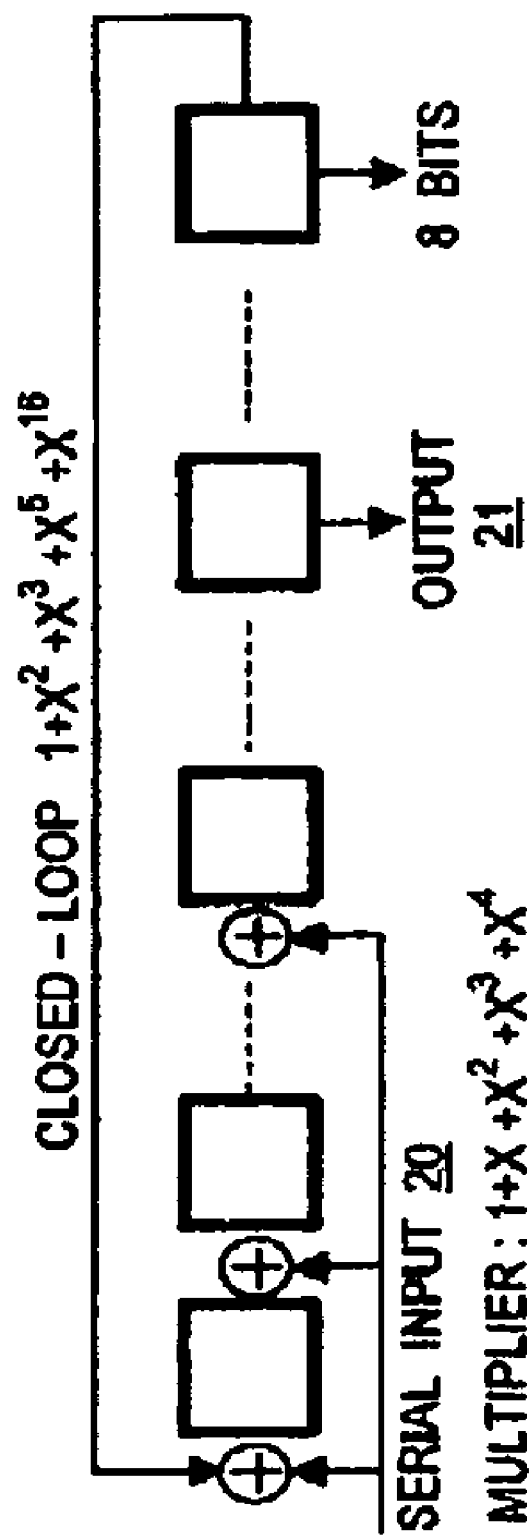
FIG. 4 is a block diagram of the output linear function.

FIG. 4 provides a diagrammatic view of exemplary means used to implement the output linear function. This function is aimed especially at smoothing the residual bias that may remain at output of the compression function. It has been designed so that, if the inputs have a residual bias augmented by a quantity $\epsilon$, then the components of the output byte will have a residual bias augmented by $\epsilon^8$ (whence the smoothing property).

The media function is made in hardware form for example by a 16-bit register, i.e. a register with 16 elementary D type flip-flop circuits. In a software form (using the language C), it is called an "unsigned short" type of word.

The output linear function comprises for example a serial input 20 and a parallel output 21 on a given number of its, for example eight bits. It produces one random byte for 16 strokes of the clock and 16 random binary symbols extracted from the arithmetic encoder. It comprises for example an internal 16-bit memory.

When the internal stage is represented by a polynomial which is, at most, a 15th degree polynomial, the transition function of this automaton is:

$$U_{t+1} \leftarrow (XU_t + e_t A) \bmod P$$

where:

$U_t$ represents the internal state of the automaton at the instant t;

A is a polynomial multiplier constant equal to: $1+X+X^2+X^3+X^4$

P is the closed-loop polynomial equal to: $1+X^2+X^3+X^5+X^{16}$ $e_t$ is the binary input at the instant t.

The automaton is, for example, a deterministic mathematical function possessing an internal state that evolves in time according to a transition function.

The numerical example given here below provides a better illustration of the principle of operation of the invention.

Choice of the Parameters of the Compressor

The arithmetic compressor (encoder) necessitates a memory to store the statistical data of the source. The size t in number of words of this memory is given by:

$$t = 2^{r+1} \times m = 2^{n(r+1)}$$

where:

r is the order of the Markovian model considered; the probabilities of appearance of the symbols depend on the r symbols preceding the source;

m is the general size of the symbols; if we consider binary n-bit symbols, we have $m=2^n$.

For a given size of memory, several combinations of parameters r and n can be envisaged. For a size of 4 Kwords, the two extreme choices are:

a zero-order model with 12-bit symbols;

an 11th-order model with binary symbols.

An experiment has been conducted with different values of the parameters r and n on a source constituted by Bernoulli random variables with parameter p=0.6. For this type of source, the maximum compression rate, obtained when the entropy of the symbols at output of the compressor is the maximum, is equal to 2.9.

The compression rates observed are given in table 1. To minimize the entropy of the symbols at output of the compressor, it must be sought to obtain the highest compression rate. These results show that it is advantageous to work on binary symbols.

The fall in the compression rate observed when the order is raised results from the fact that more time is needed to obtain discriminatory results in the statistics table. Furthermore, since the source is a zero-order source in this experiment, a zero-order compression is enough to obtain the best results.

In conclusion, the choice is that of a maximum-order model operating on binary symbols.

Performance of the Extractor

To assess the performance of the extractor, the compression function was put through the following test. The compression function works on binary symbols (n=1) and an r=8 order model. Two models of sources were simulated:

A Bernoulli source with parameter p;

A Markov source equidistributed on $\{0,1\}^8$ whose transition is controlled by a parameter p; This source has the form:

$$X_n = f(X_{n-1}, \ldots, X_{n-7}) \oplus X_{n-8} \oplus Y_n$$

where f is any equidistributed function and $(Y_n)_{n \geq 0}$ is a sequence of independent random variables following the same Bernoulli law and with parameter p; The first eight terms are the components of a random vector $(X_0, \ldots, X_7)$ with a uniform law on $\{0,1\}^8$.

The two sources cited above have been chosen for the following reasons:

1. They model a large number of physical random sources:

The case of a source where the symbols are independent but not equidistributed;

The case of a source where the symbols are equidistributed but not independent;

2. The compression rate theoretically attainable for this type of source is known; it is equal to:

$$t = 100 \times (1 - H(p)) \text{ where}$$

p is the parameter that defines the bias of the source;

H(p) is the binary entropy function equal to $-2 \log_2(p) - (1-p)\log_2(1-p)$.

A classic statistical test plan for the source before and after compression gives the following results. The size of the source is 220 bytes and the evaluation of the entropy is made on a sliding window up to the 12th order. The results are entered in the tables 3 and 4, combining the compression rate observed as well as the maximum compression grade for the type of source considered.

The examination of the results shows that the compression rate observed is very close to the theoretical rate. When it is subjected to a Markov source of an order below the order of the model of the compressor, the output of this compressor is deemed to be constituted by equidistributed and independent random symbols.

TABLE 3

Compression of a Bernoulli source with parameter p

| Parameter p | Statistical Test before compression | Observed compression rate | Statistical test after compression | Theoretical compression rate |
|---|---|---|---|---|
| 0.55 | KO | 0.5% | OK | 0.7% |
| 0.6 | KO | 2.65% | OK | 2.9% |
| 0.7 | KO | 11.65% | OK | 11.87% |
| 0.8 | KO | 27.65% | OK | 27.8% |

TABLE 4

Compression of an equidistributed Markov source with parameter to the eighth order

| Parameter p | Statistical Test before compression | Observed compression rate | Statistical test after compression | Theoretical compression rate |
|---|---|---|---|---|
| 0.55 | KO | 0.697% | OK | 0.7% |
| 0.6 | KO | 2.878% | OK | 2.9% |
| 0.7 | KO | 11.834% | OK | 11.87% |
| 0.8 | KO | 27.778% | OK | 27.8% |

What is claimed is:

1. A random number generator adapted to receive an input of a number of bits coming from a physical source, wherein the generator comprising, in combination:
   at least one symbol-generating physical source;
   an arithmetic encoder; and
   smoothing means adapted to smooth the residual output biases;
   wherein the arithmetic encoder comprises at least one table of statistics on the input symbols receiving a piece of information on contexts, several registers, one comparator and one logic unit.

2. The generator according to claim 1, wherein the smoothing means is constituted by a linear output function enabling the smoothing of the residual output biases.

3. The generator according to claim 2, wherein the smoothing means comprises a register, a serial input and a parallel output.

4. The generator according to claim 1, wherein the smoothing means comprises a register, a serial input and a parallel output.

5. A method for the generation of random numbers comprising the following steps:
   reception of several symbols from a physical source;
   transmission of the symbols to an arithmetic encoder step; and
   smoothing the encoded symbols using a linear function:
   encoding the symbols by a number derived from computations of nested intervals, an interval [ms, Ms] corresponding to a symbol s and having a size proportional to its frequency of occurrence.

6. The method according to claim 5, further comprising:
   updating a table of statistics on the input symbols as a function of the contexts;
   computing the new values of the boundaries of the interval [ms, Ms] by a rule of three; and
   emptying the registers of the most significant bits that they have in common.

7. The method according to claim 6, wherein the contexts are previous symbols.

8. The method according to claim 5, wherein the encoding comprises the following steps:
   1. initializing $m \rightarrow 0$ and $M \rightarrow 1$
   2. updating, for each symbol s of the message to be compressed:
   $\Delta \leftarrow M-m$;
   $m \leftarrow m+\Delta \times m_s$;
   $M \leftarrow m+\Delta \times M_s$
   3. choosing the compressed message as being the last value of m.

9. The method according to claim 5 wherein the smoothing function makes use of a polynomial which is, at most, a 15th degree polynomial.

* * * * *